United States Patent [19]

Uwano

[11] Patent Number: 5,321,374
[45] Date of Patent: Jun. 14, 1994

[54] TRANSVERSE ELECTROMAGNETIC MODE RESONATOR

[75] Inventor: Tomoki Uwano, Hirakata, Japan

[73] Assignee: Matsushita Electric Industrial Co., Ltd., Osaka, Japan

[21] Appl. No.: 915,925

[22] Filed: Jul. 17, 1992

[30] Foreign Application Priority Data

Jul. 19, 1991 [JP] Japan .................... 3-179481

[51] Int. Cl.⁵ .............................. H01P 1/20
[52] U.S. Cl. .................... 333/202; 333/205; 333/207; 333/219.1; 333/235
[58] Field of Search ............. 333/202, 204, 205, 206, 333/207, 219, 222, 223, 224, 225, 226, 235, 246

[56] References Cited

U.S. PATENT DOCUMENTS

| H432 | 2/1988 | Mariani et al. | 333/205 |
|---|---|---|---|
| 4,169,252 | 9/1979 | Muskiewicz | 333/205 |
| 4,342,972 | 8/1982 | Nishikawa et al. | 333/245 |
| 4,434,410 | 2/1984 | Miyake et al. | 333/224 |
| 4,536,725 | 8/1985 | Hubler | 333/202 |
| 4,590,448 | 5/1986 | Vittoria | 333/205 |
| 4,631,506 | 12/1986 | Makimoto et al. | 333/224 |
| 4,700,158 | 10/1987 | Dorsey | 333/202 |
| 4,757,286 | 7/1988 | Konishi et al. | 333/204 |
| 4,757,287 | 7/1988 | Grandfield et al. | 333/205 |
| 4,782,312 | 11/1988 | Chang et al. | 333/202 |
| 4,800,348 | 1/1989 | Rosar et al. | 333/202 |
| 4,837,529 | 6/1989 | Gawronski et al. | 333/33 |
| 4,875,025 | 10/1989 | Buoli | 333/219 |
| 4,996,506 | 2/1991 | Ishikawa et al. | 333/202 |
| 5,006,820 | 4/1991 | Prioste et al. | 333/33 |
| 5,070,313 | 12/1991 | Gladh et al. | 333/202 |
| 5,109,207 | 4/1992 | Aizawa et al. | 333/222 |
| 5,138,288 | 8/1992 | Blackburn | 333/202 |
| 5,162,761 | 11/1982 | Kita et al. | 333/219 |

Primary Examiner—Raymond A. Nelli
Attorney, Agent, or Firm—Ratner & Prestia

[57] ABSTRACT

Disclosed is a TEM mode resonator having as a means for adjusting the resonance frequency a simple frequency adjusting mechanism appropriate for size reduction while permitting easy mounting of a varactor diode for varying the resonance frequency thereto. Below a strip transmission line 2 is provided a slot 7 having a length L perpendicular to the transmission line as located at an outer ground conductor surface 3 of a one-fourth wavelength type microstrip line resonator having its one end short-circuited. According as increasing the slot length L, the resonance frequency of the resonator reduces, which characteristic is utilized as a means for adjusting the resonance frequency. By connecting a varactor diode at a center portion of the slot line and varying the voltage applied to the diode, the resonance frequency can be varied.

42 Claims, 9 Drawing Sheets

$$jn \cdot \frac{Zs}{2} \tan\beta \frac{L}{2} \approx j\frac{1}{4} n \cdot Zs \cdot \beta s \cdot L$$

TRANSVERSE ELECTROMAGNETIC MODE RESONATOR

BACKGROUND OF THE INVENTION

1. Field of the Invention

The present invention relates to a transverse electromagnetic (TEM) mode resonator which serves as an essential component of a small-size high-frequency filter to be employed in a wireless device such as a car telephone or a satellite communication device or in a voltage controlled oscillator (VCO).

2. Description of the Prior Art

In recent years, with a growing demand for movable wireless devices, in particular for car telephones, there has been a remarkable technical development in the art. In the technical development of the wireless devices, miniaturization of high-frequency filters has especially been in a rapid progress.

Each conventional high-frequency filter was constructed by air cavity type TEM mode resonators in its early production stage. However, after discovery of a ceramic material having a perovskite structure with high dielectric constant and low loss characteristics, each resonator was filled with such ceramic material thereby to reduce the length of the resonator to $1/er^{(\frac{1}{2})}$ (er: relative dielectric constant). With the reduction of the length of the resonator mentioned above, the diameter of the resonator was also reduced. Currently, a material having a relative dielectric constant (er) of not smaller than 90 has been developed to reduce the length of the resonator to approximately one tenth of that of the air cavity type and the improvement thereof has been used as a component of a portable compact telephone and the like.

There lies a problem in the production process of the above-mentioned new type filter which makes it necessary to process a frequency adjustment therefor. A ceramic material is obtained through a firing process, and the physical constants thereof depend on the conditions of the firing process, small variations in mixture ratio of impurities, and other factors. Therefore, any filter constructed by combining resonators employing the above-mentioned ceramic material indispensably necessitates a frequency adjustment procedure. Conventionally, there has been known as an example of frequency adjustment means a coaxial dielectric resonator loaded with a trimmer having a frequency adjustment function.

The following describes the coaxial dielectric resonator (TEM mode resonator) with reference to the attached drawings.

Figure 14:
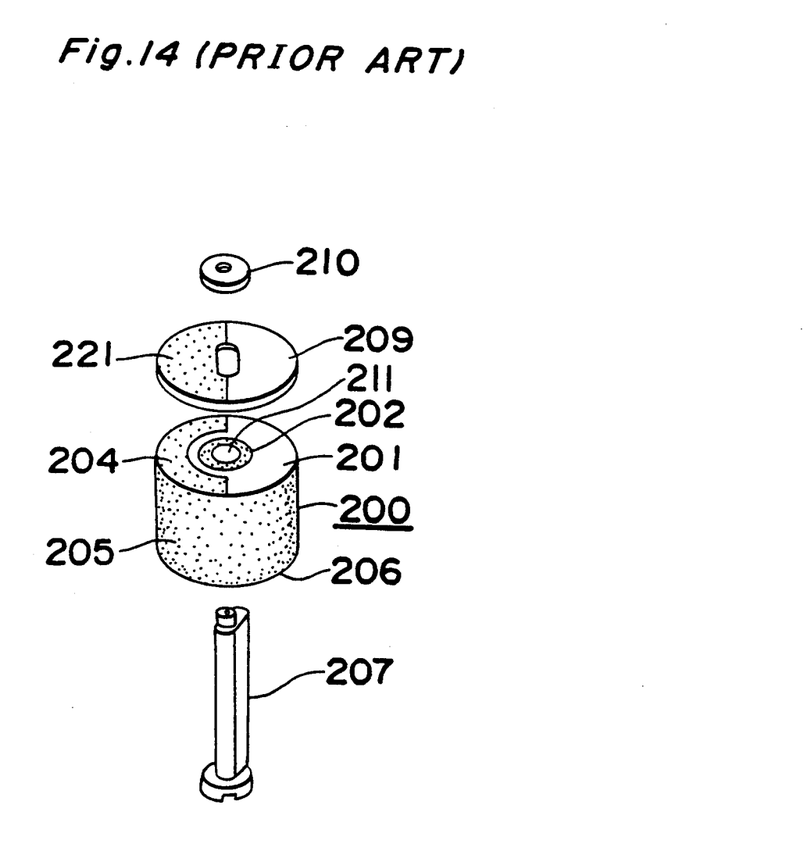
FIG. 14 is an exploded view of a conventional TEM mode resonator having a resonance frequency trimmer.

FIG. 14 shows an exploded view of a conventional TEM mode resonator having a frequency adjustment function. Referring to FIG. 14, reference numeral 200 denotes a thick and large cylindrical dielectric body, where the circumferential surface thereof is covered with an outer conductor 205 and the bottom surface thereof is covered with a bottom conductor 206. The inner peripheral wall of the cylindrical body is also covered with an inner conductor serving as a central conductor 211 which is connected to the bottom conductor 206 at the bottom surface of the dielectric body 200. On an open end surface 201 of the dielectric body 200, there is provided an electrode 204 serving as a trimmer fixing electrode in connection with the outer conductor 205 as shown in FIG. 14. On the other hand, a rotor dielectric plate 209 is provided with a rotor electrode 221 disposed on a half area of the upper surface thereof. The coaxial dielectric body 200 and the rotor plate 209 constructed as mentioned above are combined with each other by inserting a conductor shaft 207 therethrough and secured with a ring member 210 at the top.

The central conductor 211 and the conductor shaft 207 have the same potential, while the rotor electrode 221 connected to the conductor shaft 207 has the same potential as that at a tip portion of the central conductor 211. There is provided a ring conductor 202 coaxially disposed on the open end surface 201 for stabilizing position of the rotor so as to ensure smooth rotation of the rotor.

The following describes the operation of the TEM mode resonator constructed as mentioned above.

One end surface of the coaxial portion is short-circuited via the bottom conductor 206, while at the other end surface, the central conductor and the outer conductor 205 are connected via a trimmer capacitor having a capacitance Ct with a trimmer function, and the coaxial portion has its length shorter than one-fourth of the wavelength of the resonance frequency. In the above case, the resonance frequency of the resonator having the coaxial structure can be expressed by an equation as follows.

$$Zo \cdot \tan(\beta h) = 1/(\omega Ct)$$

where Zo represents a characteristic impedance, $\beta$ represents a propagation constant, h represents the length of the coaxial portion, and $\omega$ represents an angular frequency. The resonance frequency varies depending on the variation of the capacitance Ct.

As another example for varying the resonance frequency, there is a method of varying the length of the resonator. A TEM mode coaxial dielectric resonator having its one end short-circuited and the other end opened has a resonance frequency where the electric length of the resonator is one forth of the resonance frequency. The most effective means for changing the length of the resonator is to mechanically abrade the open end surface, which method is currently used widely.

On the other hand, the same frequency adjustment is necessary for a TEM mode resonator to be employed in a VCO. By connecting a varactor diode having a capacitance Cv in parallel with a resonator having trimmer construction as mentioned above, the resonance frequency can be varied with a voltage variably applied to the varactor diode, thereby varying the oscillation frequency. Since each varactor diode has a different capacitance, the center frequency can be adjusted by adjusting the trimmer capacitance Ct. When employing a resonator having no trimmer construction, there is also adopted a method of connecting a varactor diode in parallel with the coaxial resonator in the same manner as described above, where the center frequency is controlled by abrading the tip end surface of the coaxial resonator.

However, the coaxial dielectric resonator having the trimmer construction has several drawbacks because the resonator is bulky due to its inherent construction. That is, in view of the growing demand for further reducing the size of the current portable wireless device to a pocket size, the resonator size is required to be as small as possible. Furthermore, in order to secure a sufficient trimmer capacitance, there is a certain limitation in reducing the area of the open end surface of the coaxial body and consequently in reducing the diameter of the coaxial resonator, which is also an obstacle in reducing the size of the resonator. For the same reason, when such a coaxial resonator is employed in a VCO, it is necessary to prevent the variation in capacitance of the varactor diode from exceeding the compensation range with the trimmer, and therefore, the trimmer size and the resonator diameter cannot be reduced.

On the other hand, the method of abrading the open end surface in the axial direction of the coaxial body is very simple, however, the most serious drawback is that the end surface cannot be restored after it is abraded. For restoration, it is necessary to connect somewhat capacitive component or attach a dielectric chip so that the electric field at the open end concentrates. Either one of the above-mentioned restoration procedures requires a troublesome work resulting in significantly reducing the productivity. Particularly when producing a filter having a plurality of resonators to be adjusted at the same time, even skilled workers are required to perform a time-consuming processing work with high concentration and care so as not to excessively abrade the end surface.

SUMMARY OF THE INVENTION

Accordingly, an essential object of the present invention is to provide a TEM mode (tunable stripline) resonator having a simple frequency adjustment mechanism suitable for miniaturization and such a construction that it facilitate to employ a varactor diode for varying the resonance frequency of the resonator.

In order to give solution to the aforementioned problems, the present invention provides a TEM mode resonator comprising an outer conductor having a ground potential; a floating line conductor arranged apart from and in parallel with the outer conductor, the line conductor operating to allow a standing-wave current to flow therethrough to form a TEM mode or quasi TEM mode electromagnetic field around the line conductor; and a slot line having both ends of its short-circuited while being located in the closest proximity and perpendicular to the line conductor on the outer conductor, whereby the resonance frequency of the resonator is varied by varying the length of the slot line, otherwise, by connecting a capacitive element across the slot lines, the variable resonance frequency of the resonator is adjusted by varying the capacitance of the capacitive element.

According to a feature of the present invention, the resonance frequency is adjusted by varying the slot length. When the slot length is extended, the resonance frequency reduces. The frequency variation amount with respect to the slot length can be adjusted according to the slot width and the slot position, which ensures a high degree of freedom in designing the adjustment mechanism.

Any conventional frequency adjustment method has adopted a means of adding or reducing a capacitance provided at the open end of the transmission line of the resonator. On the contrary, the frequency adjustment system in accordance with the present invention has such an equivalent circuit that an inductive element is inserted serially in the transmission line without substantially changing the shape of the resonator nor adding any element. The above-mentioned construction facilitates producing a small-size resonator having a wide frequency adjustment range. Furthermore, any conventional frequency adjustment method can be incorporated to the present invention, which further enhances the effect of the present invention.

BRIEF DESCRIPTION OF THE DRAWINGS

These and other objects and features of the present invention will become apparent from the following description taken in conjunction with the preferred embodiment thereof with reference to the accompanying drawings, in which:

FIG. 1 (a) is a perspective view of a TEM mode resonator in accordance with a first embodiment of the present invention;

FIG. 1 (b) is a bottom view of the TEM mode resonator of the first embodiment of the present invention;

FIG. 2 (a) is an equivalent circuit diagram for explaining the operation of the first embodiment of the present invention;

FIG. 2 (b) is a simplified equivalent circuit diagram for explaining the operation of the first embodiment of the present invention;

FIG. 3 (a) is a graph of a resonance frequency characteristic of the TEM mode resonator of the first embodiment of the present invention;

FIG. 3 (b) is a graph of another resonance frequency characteristic of the TEM mode resonator of the first embodiment of the present invention;

DETAILED DESCRIPTION OF THE PREFERRED EMBODIMENTS

The following describes an exemplified TEM mode resonator in accordance with an embodiment of the present invention with reference to the attached drawings.

EXAMPLE 1

Figure 1A:
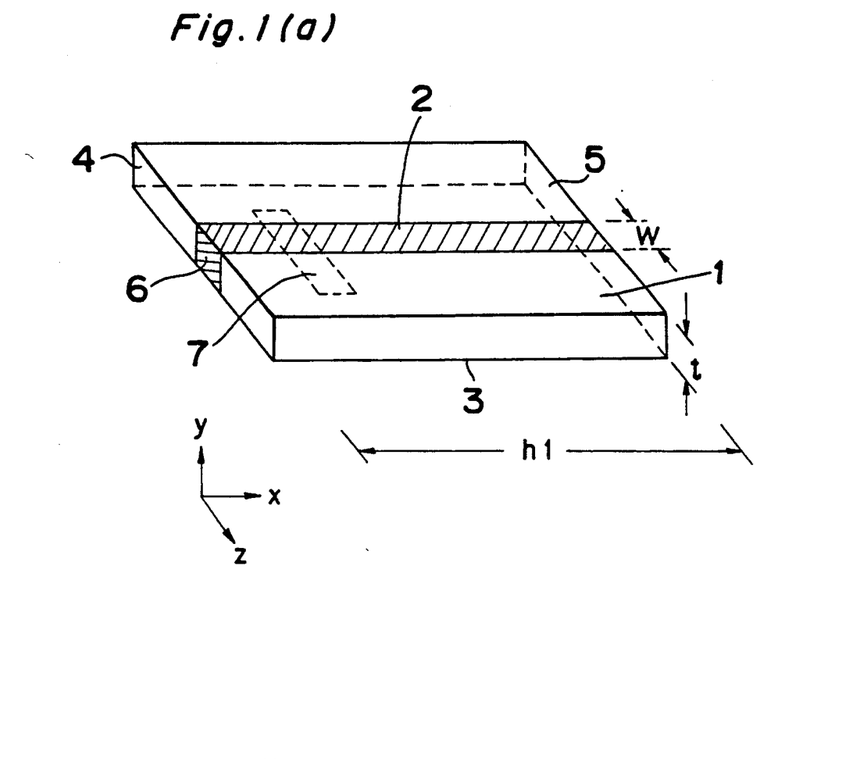
Figure 1B:
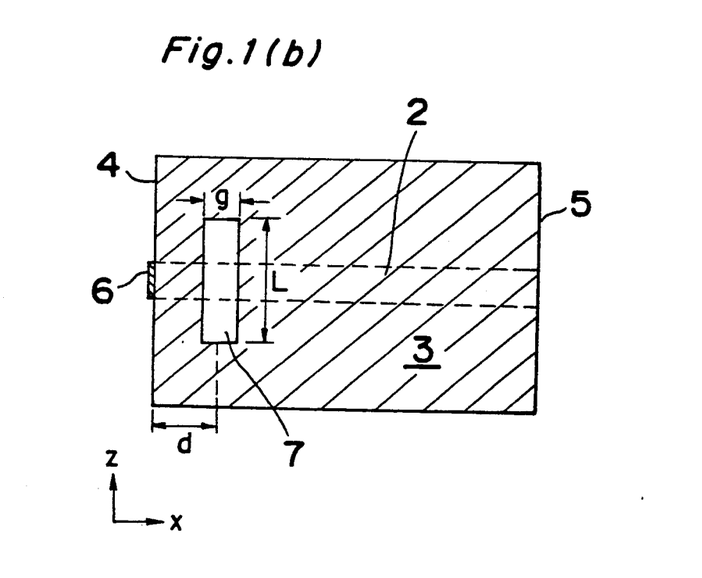

FIGS. 1 (a) and 1 (b) show a TEM mode (tunable stripline) resonator having a microstrip line structure in accordance with a first embodiment of the present invention. In FIGS. 1 (a) and 1 (b), depicted by a reference numeral 1 is a dielectric substrate having a thickness of t, numeral 2 is a microstrip transmission line conductor (floating line conductor) having a width w, and numeral 3 is a ground outer conductor adhered to the rear surface of the dielectric substrate 1. Depicted by reference numerals 4 and 5 are edge surfaces of the substrate 1 constructed with a microstrip line structure, numeral 6 is a short-circuit conductor provided on the edge surface 4 for connecting the microstrip transmission line 2 on the upper surface of the substrate 1 with the outer conductor 3 on the rear surface of the substrate 1, and numeral 7 is a slot transmission line having a width of g provided on the outer conductor 3, where both ends of the slot line 7 are short circuited by the outer conductor 3 so as to achieve its line length L. The slot line 7 is located apart from the edge surface 4 by a distance d as arranged symmetrically and perpendicularly with respect to the microstrip line 2. The microstrip line 2 having a length of h1 has its one end opened at the edge surface 5 and its other end closed by the short-circuit conductor 6. The microstrip line 2 is so arranged as to allow a standing-wave current to flow therethrough to form a TEM mode or quasi-TEM mode electromagnetic field around the microstrip line 2. In FIGS. 1 (a) and 1 (b), there is shown a coordinate system for explaining the operation of the resonator, while hidden principal portions are indicated by broken lines. The same arrangement is adopted in the other drawings.

The following describes the operation of the TEM mode resonator having the structure as mentioned above with reference to FIGS. 1 through 3.

Figure 2A:
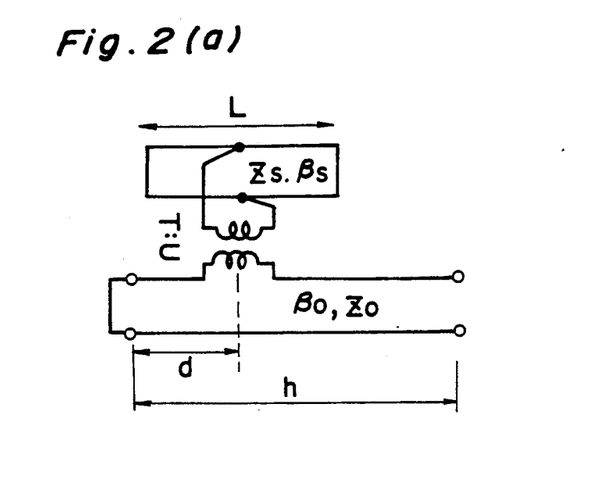

Firstly referring to FIGS. 1 (a) and 1 (b), when the electrical slot length L (hereinafter referred to as slot length) of the slot line 7 is zero (L=0), that is, the entire rear surface of the substrate 1 is covered with the ground outer conductor 3, if ignoring for convenience the discontinuous behavior of electromagnetic fields at the edge surfaces 4 and 5, the resonator shown in FIGS. 1 (a) and (b) resonates at a frequency where the electric length of the microstrip line 2 is one fourth of the resonance frequency wavelength as is well known. When there is provided a slot line 7, various electric field components exist on the slot line 7, where an electric field of Ex component (in a direction of the x-axis) represents the traveling wave (standing wave) on the slot line 7. Postulating now that the slot length is L as shown in FIG. 1 (b), the resonator can be represented by a simplified equivalent circuit as shown in FIG. 2 (a). FIG. 2(a) shows the equivalent circuit of the crossing section between the microstrip line 2 and the slot line 7 in a form of an ideal transformer having an impedance ratio of n:1. In FIG. 2 (a), Zs represents the characteristic impedance of the slot line, βs represents the propagation constant of the slot line, Zo represents the characteristic impedance of the microstrip line 2, βo represents the propagation constant of the microstrip line, and h represents the length of the entire microstrip line portion. To be exact, the equivalent circuit depends on the slot width g, strip line width w, thickness t, dielectric constant of the dielectric substrate and the frequency because of the discontinuity at the crossing portion, however, the above-mentioned factors are now ignored for simplification in explaining the qualitative behavior of the circuit as follows.

Figure 2B:
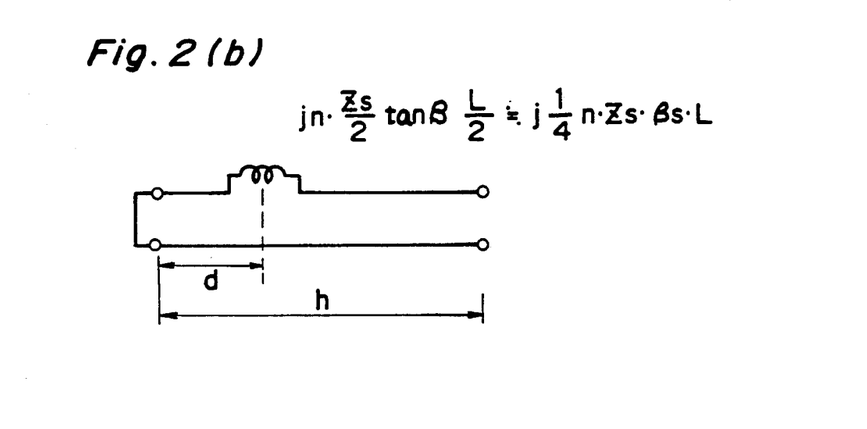

Assuming now that the slot length L is sufficiently shorter than the resonance frequency wavelength, the equivalent circuit of the slot line of which impedance is multiplied by n by the operation of the ideal transformer can be further expressed as a small inductance inserted serially in the transmission line as shown in FIG. 2 (b). By the operation of the inductance, the resonance frequency of the resonator is reduced. The inductance value is represented as a function of the slot length L as indicated by a following equation shown in FIG. 2 (b).

$$jn \cdot (Zs/2)\tan(\beta s)L/2 \approx j(\tfrac{1}{2})n \cdot Zs \cdot \beta s \cdot L$$

Figure 3A:
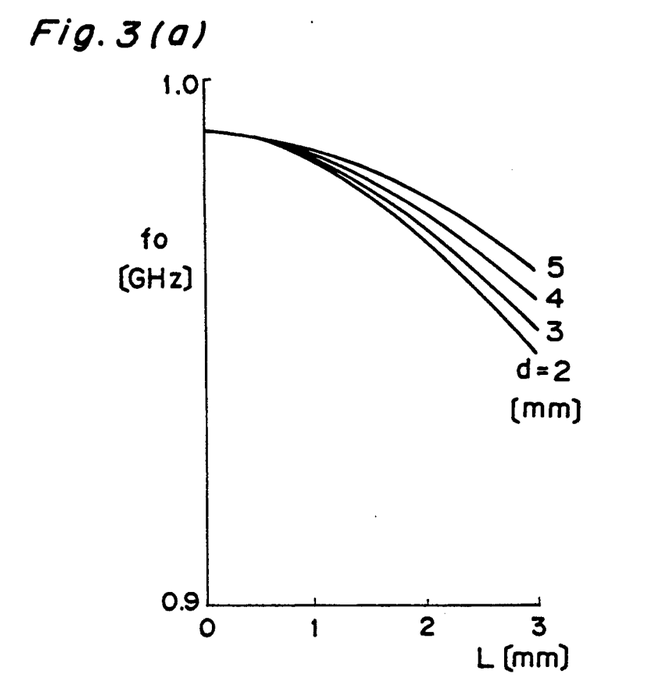
Figure 3B:
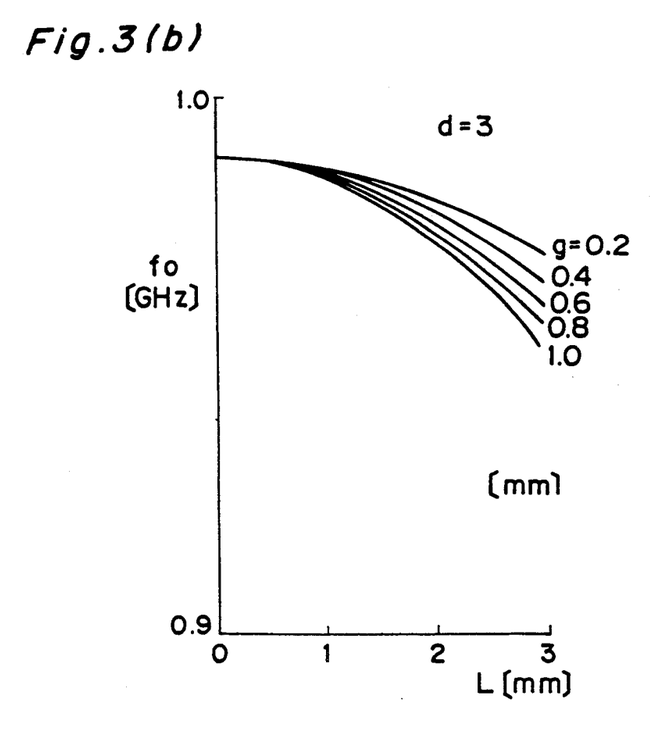

Therefore, by varying the length L, the resonance frequency can be easily varied. The variation ratio of the resonance frequency with respect to the variation of the slot length L can be expressed by a function having the parameters of g, d, and w. Examples of the calculation of the function are shown in FIGS. 3 (a) and 3 (b). In FIG. 3 (a), the parameters of h, t, w, g and Er are fixed to h1=10 mm, t=1 mm, w=1 mm, g=1 mm and Er=90, and in the cases shown the parameter d=2, 3, 4 and 5 [mm]. The function of the resonance frequency fo [GHz] is obtained by varying the slot length L. In FIG. 3 (b), in the cases of taking the parameter g=0.2, 0.4, 0.6, 0.8 and 1.0 [mm], the function of the resonance frequency fo [GHz] is obtained by varying the slot length L.

According to the first embodiment of the TEM mode resonator described as above, by providing a small slot line 7 perpendicular to the microstrip transmission line 2 on the ground outer conductor 3 on the rear surface of the dielectric substrate 1, the resonance frequency of the TEM mode resonator can be adjusted by varying the slot length L.

EXAMPLE 2

Figure 4:
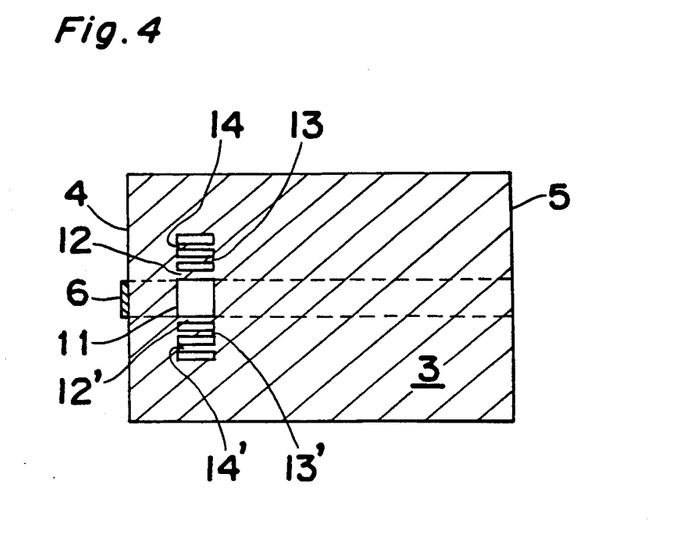
FIG. 4 is a bottom view of a slot line of a TEM mode resonator in accordance with a second embodiment of the present invention.

The following describes a TEM mode resonator in accordance with a second embodiment of the present invention with reference to FIG. 4.

FIG. 4 shows a conductor pattern of a slot portion provided on a ground outer conductor 3 of a TEM mode resonator having a microstrip line structure. In FIG. 4, components of the TEM mode resonator are denoted by the same numerals as those in FIG. 1, having the same constructions and operations. Reference numeral 11 denotes a slot line portion which is short circuited via short-circuit conductors 12, 13, 14, 12', 13', and 14'. The short-circuit conductors 12 and 12' are located symmetrically apart from the center of the slot line portion 11 by the same distance. The same relation exists between the short-circuit conductors 13 and 13' as well as between the short circuit conductors 14 and 14'.

In the second embodiment having the above-mentioned construction, by removing the short-circuit conductors 12, 12' through 14, 14' across the slot line portion 11 sequentially from those located closer to the center to the outward side (12, 12' to 14, 14'), the length of the slot line 11 can be varied in equivalence. In detail, the initial length of the slot line 11 coincides with the length between the short circuit conductors 12 and 12'. When the short-circuit conductors 12 and 12' are removed, the electrical length of the slot line 11 coincides with the length between the short-circuit conductors 13 and 13'. The same procedure as described above is repeated in turn at need. In regard of removing the short-circuit conductors, it is not always necessary to completely remove the short-circuit conductors for the reason that the connection across the slot line portion 11 is merely required to be opened at its ends, which enables removing the short-circuit conductors with ease by such mechanical means as cutting or abrading a part of the conductors.

The following describes several other embodiments of the present invention with reference to FIGS. 5 to 13.

EXAMPLE 3

Figure 5:
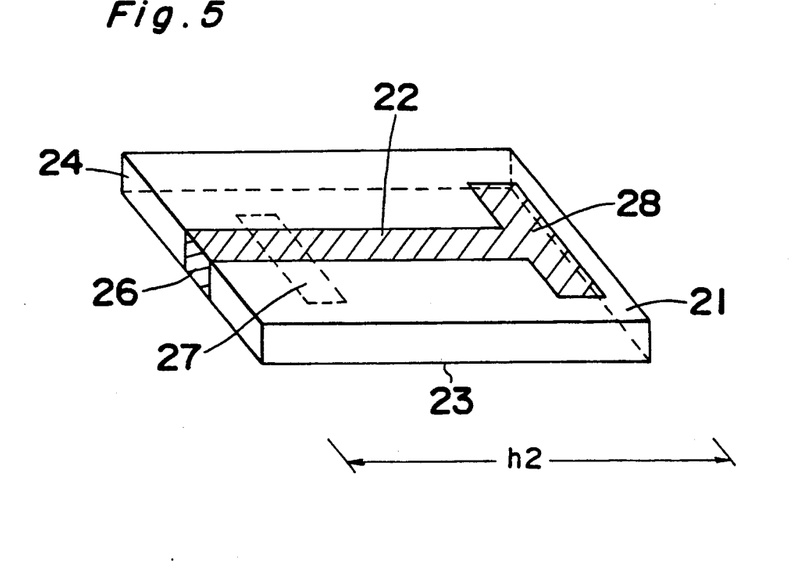
FIG. 5 is a perspective view of a TEM mode resonator in accordance with a third embodiment of the present invention.

FIG. 5 shows a TEM mode resonator having a microstrip line structure in accordance with a third embodiment of the present invention. Referring to FIG. 5, denoted by reference numeral 21 is a dielectric substrate, and numeral 22 is a microstrip line conductor whose one end is connected to a ground outer conductor 23 via a short-circuit conductor 26 provided on one end surface 24 of the dielectric substrate 21. On the ground outer conductor 23, there is provided a slot line portion 27 similar to the slot line 7 shown in FIG. 1 (b). The other end of the microstrip line 22 is connected to a plane conductor 28 having a wide area opposite to the ground outer conductor surface 23. The plane conductor 28 has a capacitance between itself and the ground to thereby make the resonator length h2 not greater than one-fourth of the resonance frequency wavelength. The slot line 27 operates in the same manner as the first embodiment of the TEM mode resonator having a microstrip line structure shown in FIG. 1, which enables achieving a small size resonator, which is also an advantageous feature of the present invention.

EXAMPLE 4

Figure 6:
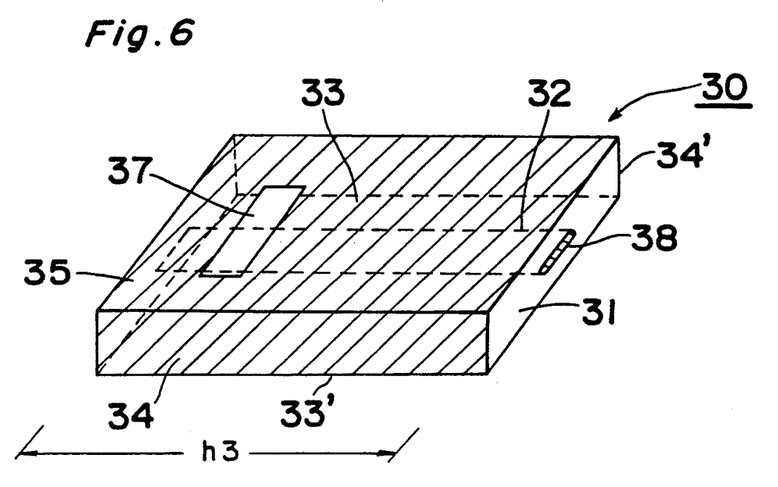
FIG. 6 is a perspective view of a TEM mode resonator in accordance with a fourth embodiment of the present invention.

FIG. 6 shows a TEM mode resonator 30 having a flat-plate conductor shield in accordance with a fourth embodiment of the present invention. Referring to FIG. 6, designated by a reference numeral 32 is a central conductor, numerals 33 and 33' are upper and lower outer conductors, numerals 34 and 34' are side outer conductors, and numeral 35 is a bottom outer conductor. The central conductor 32 is connected to the bottom outer conductor 35 at the bottom surface of the resonator 30. The inside of the resonator 30 is filled with a dielectric material 31 and also may be filled with air. A slot line portion 37 is provided on the upper outer conductor 33. The slot may be provided on the lower outer conductor 33' instead. Although the central conductor 32 is a strip conductor having a linear section shape in FIG. 6, the conductor 32 may have a polygonal, circular, oval, or other section shape instead. In FIG. 6, hidden portions are indicated by broken lines.

The operation of the slot line portion 37 having the construction as shown in FIG. 6 is essentially equal to that of the construction of the first embodiment in FIG. 1, and therefore the slot portion 37 can be represented by the same equivalent circuit. It is noted that, since the electromagnetic field is distributed in the upper and lower outer conductors 33 and 33', the effect of the slot portion 37 is reduced. This means that the n value of the ideal transformer is reduced in the equivalent circuit. This TEM mode resonator having the above-mentioned construction is totally-shielded to prevent the possible electromagnetic radiation from the transmission line to the environmental space. Among the outer conductors, those which have no slot (i.e., the outer conductors except 33 in FIG. 6) can be treated as conductors having a complete ground potential thereby to facilitate mounting the resonator onto a circuit board. By connecting an open end 38 of the central conductor 32 with either one of the outer conductors 33, 33', 34, and 34' by way of a capacitive element, the resonator length h3 can be made not greater than one fourth of the resonance frequency wavelength to enable achieving a small-size resonator.

EXAMPLE 5

Figure 7:
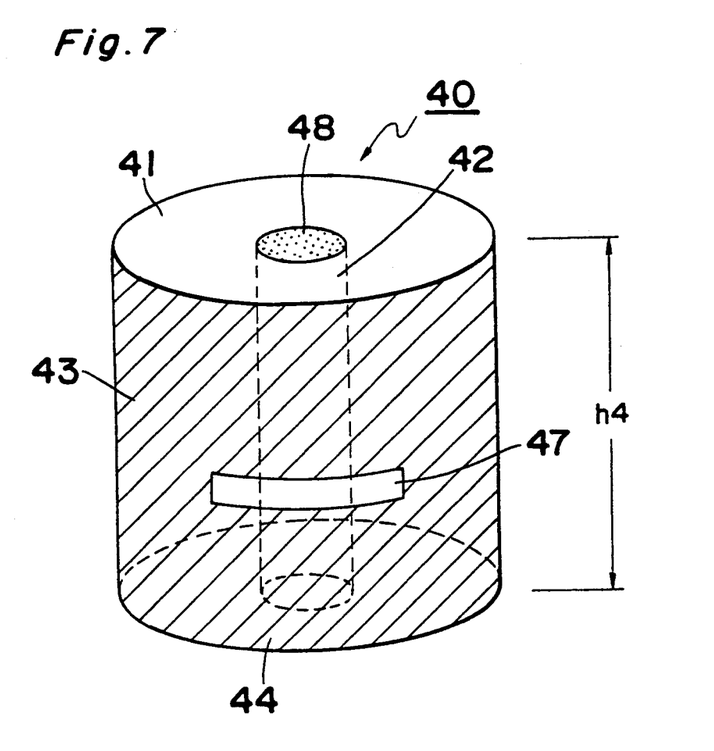
FIG. 7 is a perspective view of a TEM mode resonator in accordance with a fifth embodiment of the present invention.

FIG. 7 shows a coaxial TEM mode resonator 40 in accordance with a fifth embodiment of the present invention. Referring to FIG. 7, designated by a reference numeral 42 is a central conductor, numeral 43 is a circumferential outer conductor, and numeral 44 is a bottom outer conductor, where the inside of the resonator 40 is filled with a dielectric material 41. The central conductor 42 has its one end grounded to the bottom outer conductor 44 at the bottom surface of the resonator 40 and has its other end 48 opened. On the circumferential outer conductor 43, there is provided a slot line portion 47 oriented in the circumferential direction. The operation of the slot portion 47 is similar to that of the fourth embodiment shown in FIG. 6. By connecting the open end 48 with the circumferential outer conductor 43 by way of a capacitive element interposed therebetween, the resonator length h4 can be made not greater than one fourth of the resonance frequency wavelength thereby to enable achieving a small-size resonator.

EXAMPLE 6

Figure 8:
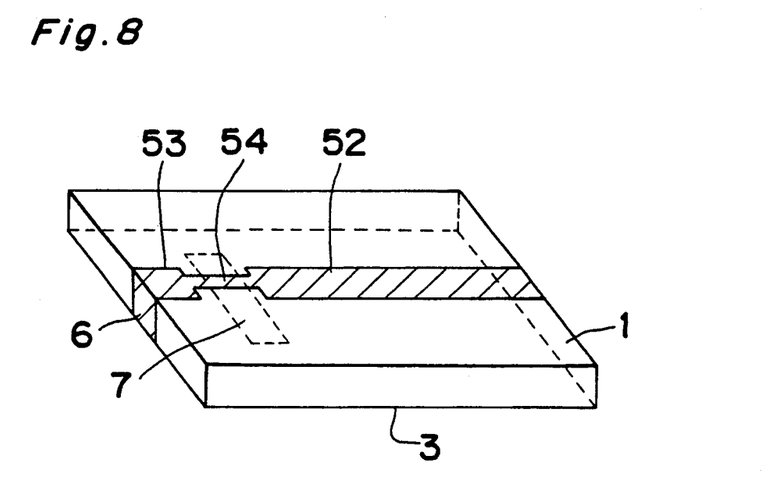
FIG. 8 is a perspective view of a TEM mode resonator in accordance with a sixth embodiment of the present invention.

FIG. 8 shows a TEM mode resonator having a microstrip line structure in accordance with a sixth embodiment of the present invention. In FIG. 8, components of the resonator are denoted by the same numerals as those of the first embodiment in FIG. 1, having the same constructions and operations. Designated by reference numerals 52, 53, and 54 are microstrip line conductor portions having different widths. In a microstrip line resonator, there exists a characteristic impedance appropriate for designing a circuit, and therefore the widths of the microstrip line conductor portions 52 and 53 are so designed as to achieve the appropriate impedance value. On the other hand, the line conductor portion 54 crossing over a slot portion 7 has a width designed in accordance with the operation of the slot portion 7. By adopting the above mentioned arrangement, it is easy to provide a resonator which concurrently satisfies the needs in designing for applying the resonator to another electronic circuit as well as the needs for determining the variation amount of the resonance frequency. The above-mentioned construction can effect the same function as in the resonators shown in FIGS. 5, 6, and 7 other than the resonator having the normal microstrip line structure.

EXAMPLE 7

Figure 9:
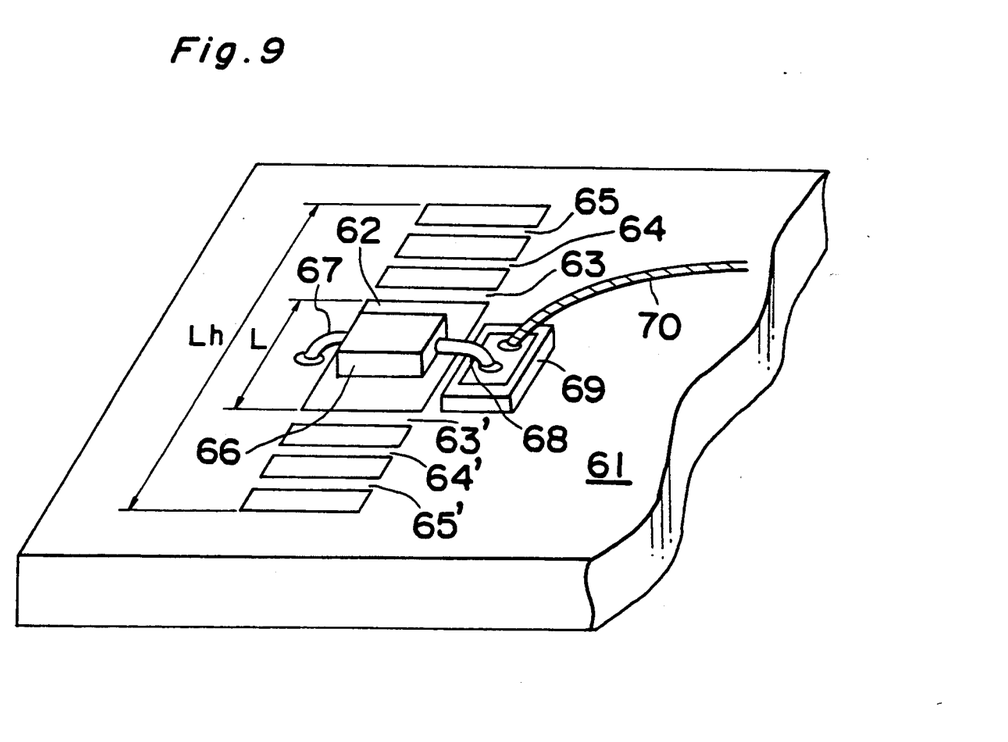
FIG. 9 is a perspective view of a circuit arrangement at a slot portion of a TEM mode resonator in accordance with a seventh embodiment of the present invention.

The following describes a seventh embodiment of the present invention with reference to FIG. 9.

FIG. 9 shows a TEM mode resonator in accordance with the seventh embodiment of the present invention exhibiting a slot portion provided on an outer conductor and components provided in the vicinity of the slot portion in any one of the constructions shown in FIGS. 1, 5, 6, 7, and 8. Referring to FIG. 9, designated by reference numeral 61 is a ground outer conductor, numeral 62 is a slot line portion. A plurality of short-circuit conductors 63, 63', 61, 64', 65, and 65' are provided across the slot line 62 for short-circuiting the slot line 62. The innate electrical length of the slot portion 62 is Lh, however, the effective electrical length thereof is L due to the operation of the short-circuit conductors. On the central portion of the slot line portion 62, there is provided a varactor diode 66 which is connected across the slot line 62. One terminal 67 of the varactor diode 66 is connected directly to the conductor at one side of the slot line 62, while the other terminal 68 of the varactor diode 66 is connected to the other conductor at the other side of the slot line 62 via a DC current cutoff plate capacitor 69. To the terminal 68 is applied a DC voltage by way of a lead 70.

Figure 10:
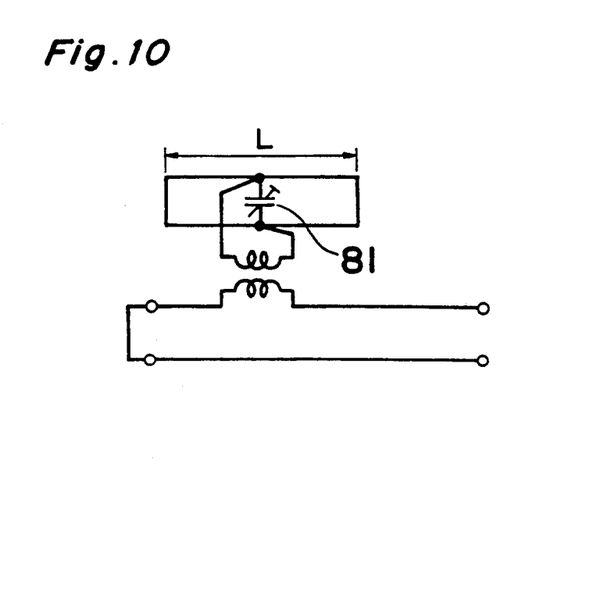
FIG. 10 is an equivalent circuit diagram of a TEM mode resonator of the seventh embodiment of the present invention.

The following describes the operation of a TEM mode resonator having a slot circuit arrangement as mentioned above with reference to FIGS. 9 and 10. The TEM mode resonator having a slot circuit arrangement as shown in FIG. 9 corresponds to an equivalent circuit as shown in FIG. 10. The difference between FIG. 10 and FIG. 2 (a) is that a capacitor 81 is connected in parallel at the center portion of the slot line having an electrical length L in the circuit in FIG. 10. The capacitor increases the value of inductance inserted equivalently in the transmission line thereby to further reduce the resonance frequency. Assuming now that the capacitor is a varactor diode and the capacitance varies according to the variance of voltage applied to the diode, the above-mentioned equivalent inductance also varies to enable varying the resonance frequency by varying the application voltage. Adjustment of the center frequency of variation range with respect to the application voltage can be adjusted by successively removing the plural short-circuit conductors 63, 63', 64, 64', 65, and 65'.

The TEM mode resonator of this type has a feature that a varactor diode can be easily mounted onto the outer conductor of the resonator. This type resonator can also cope with the dimensions of the varactor diode to be mounted in a compact form practically covering a range from a beam-lead type small one to a large one enclosed in a glass capsule. Since the equivalent impedance inserted serially in the transmission line of the resonator is composed of a parallel circuit consisting of the inductance of the slot and the capacitance of the capacitor, the resonator can flexibly cope with the varactor diode characteristics by varying the slot length to achieve a high degree of freedom in designing. By using a chip capacitor having a fixed capacitance instead of the varactor diode, the resulting resonator has a fixed resonance frequency. In the above case, the resonance frequency is further reduced as compared with the case where only the slot line exists, thereby enabling to achieve a very small resonator. When using a capacitor having a fixed capacitance, the capacitor 69 is not necessary.

EXAMPLE 8

Figure 11:
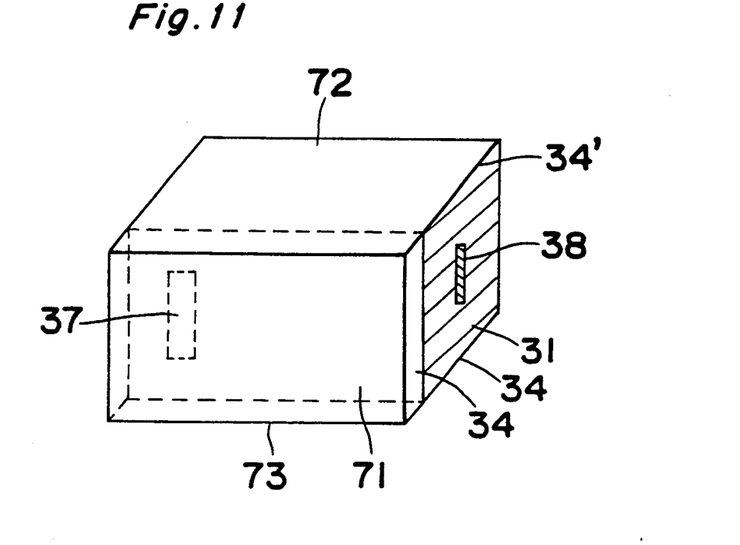
FIG. 11 is a perspective view of a TEM mode resonator in accordance with a eighth embodiment of the present invention.

FIG. 11 shows a TEM mode resonator in accordance with an eighth embodiment of the present invention, which is applied to the fourth embodiment of the TEM mode resonator shown in FIG. 6. In FIG. 11, the same components as in FIG. 6 are denoted by the same numerals. Referring to FIG. 11, designated by a reference numeral 71 is a shield conductor 71 for covering a slot line portion 37, numerals 72 and 73 are support conductors for supporting the shield conductor 71 as closely adhered to side conductors 34 and 34'. A hidden portion of an upper conductor 33 behind the shield conductor 71 is indicated by broken lines. The distance between the upper conductor 33 and the shield conductor 71 can be reduced shorter than the width of the slot portion 37.

In such a resonator having its slot portion covered with a shield member, it is possible to enclose weak electromagnetic energy radiated from the slot opening to prevent the Q value from deteriorating. Since the electromagnetic field on the slot opening surface is mostly concentrated to the inside of the slot surface, even when the shield conductor is put close to the slot portion, the resonance frequency is less influenced. The same effect of the shield conductor can be obtained in a TEM mode resonator having a microstrip line structure or a coaxial structure.

Figure 12:
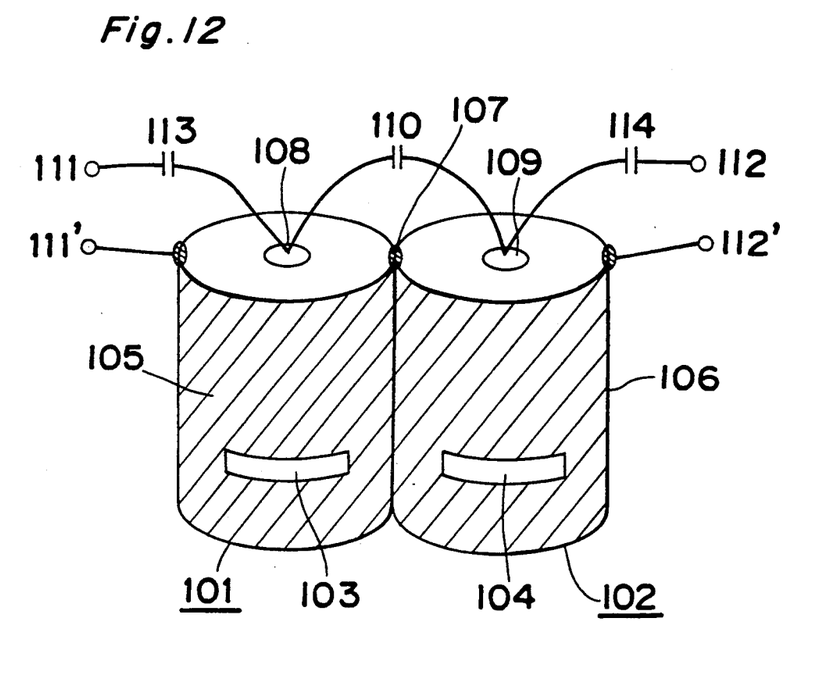
FIG. 12 is a schematic view of a filter to which a TEM mode resonator of the fifth embodiment of the present invention is applied.

FIG. 12 shows a filter construction formed by combining resonators having a coaxial structure as shown in FIG. 7 which is a TEM mode resonator of the fifth embodiment of the present invention. Referring to FIG. 12, reference numerals 101 and 102 denote resonators having slot portions 103 and 104 respectively for adjusting the resonance frequency, and the resonators have respectively ground outer conductors 105 and 106 which are connected at a connection point 107. The open end portions 108 and 109 of the respective central conductors of the resonators 101 and 102 are coupled by way of a coupling capacitor 110. There are provided input terminals 111 and 111' and output terminals 112 and 112', where the ground terminals 111' and 112' are connected to the ground outer conductors 105 and 106, while the signal terminals 111 and 112 are connected to the open end portions 108 and 109 via respective coupling capacitors 113 and 114. By varying the equivalent length of the slots 103 and 104, the resonance frequencies of the resonators 101 and 102 can be adjusted. By connecting a varactor diode at a center portion of each of the slots 103 and 104 according to the construction shown in FIG. 9 and making the two application voltages equal, the resonators form a variable tuning bandpass filter corresponding to the application voltages.

Figure 13:
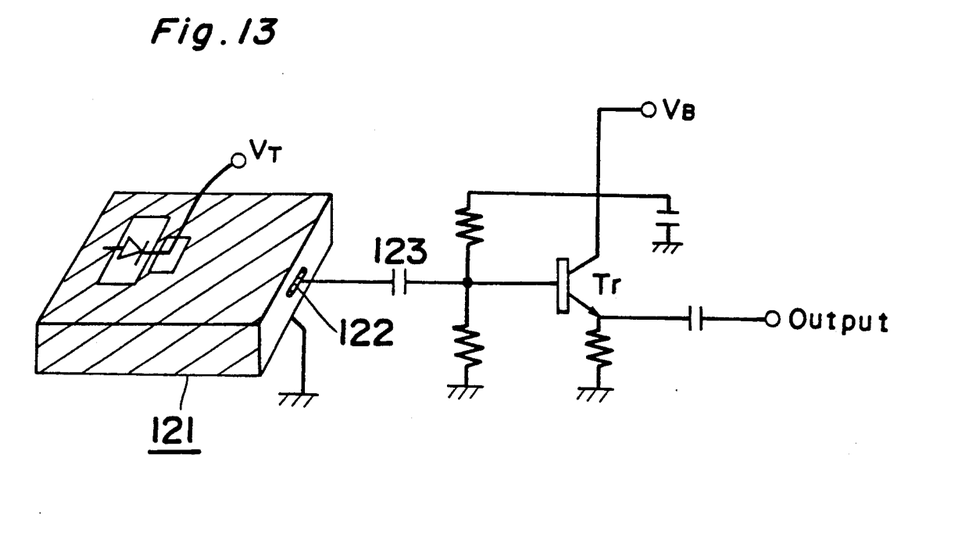
FIG. 13 is a circuit diagram of a VCO to which a TEM mode resonator of the fourth and seventh embodiments of the present invention is applied.

FIG. 13 shows a VCO to which is applied a variable frequency resonator formed by incorporating a varactor diode circuit having a construction of the seventh embodiment as shown in FIG. 9 to a TEM mode resonator having a construction of the fourth embodiment as shown in FIG. 6. Referring to FIG. 13, reference numeral 121 denotes a variable resonance frequency TEM mode resonator, where an open end 122 of a line conductor is connected to a base of a transistor Tr by way of a coupling capacitor 123. The transistor Tr forms a feedback circuit through floating capacitance between the collector and the emitter as well as between the emitter and the base to form a Colpitts oscillator. Depending on an application voltage Vt to the varactor diode, the oscillation frequency varies.

According to the present invention as described above, by providing a slot portion having a variable electrical length L directed perpendicularly to a transmission line in the closest proximity to the transmission line on the ground outer conductor of the TEM mode resonator, the resonance frequency of the resonator can be varied by varying the slot length L. The variation ratio of the resonance frequency with respect to the variation of the slot length L is moderate and the variation ratio can be easily adjusted. In addition, the variation ratio of the resonance frequency can be also changed by means of varying the slot line width or the slot position along the transmission line to assure a degree of freedom in adjustment. In order to vary the slot length L, there is a method of removing short-circuit conductors provided across the slot line, and the method can be easily effected by mechanical means. When the resonance frequency is too low, the resonator length can be reduced by abrading the open end surface of the resonator, which conventional method can be also incorporated to the present invention to make the present invention more effective.

Furthermore in a TEM mode resonator having the construction of connecting a capacitor at the center portion of the slot portion thereof, the resonance frequency can be further reduced to enable achieving a further reduction in resonator size. By employing a varactor diode instead of the capacitor at the center portion of the slot, a TEM mode resonator having a variable resonance frequency can be obtained by varying the application voltage to the diode.

According to a TEM mode resonator of the present invention described as above, a small-size resonator capable of adjusting the resonance frequency in a simple construction can be achieved, and therefore the resonator of the present invention can be easily applied to a variety of electronic circuits while assuring the advantageous feature of minimizing the size of each circuit to which the resonator is applied.

Although the present invention has been fully described by way of examples with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

What is claimed is:

1. A tunable stripline resonator comprising:
   an outer ground conductor having a ground potential adhered to one surface of a dielectric substrate;
   a floating line conductor arranged apart from and in parallel with said outer ground conductor, said floating line conductor allowing a standing-wave current to flow therethrough to form one of a TEM mode and quasi-TEM mode electromagnetic field around said line conductor; and
   a slot line located on said outer ground conductor in close proximity and perpendicular to said floating line conductor, said slot line having two ends which are shorted by said outer ground conductor and an electrical length for varying the resonance frequency of the resonator.

2. The tunable stripline resonator as claimed in claim 1, wherein said slot line comprises a plurality of shorting conductors provided transversely thereon for creating transverse short circuits across said slot line, and wherein successive removal of said shorting conductors results in the effective varying of the electrical length of said slot line causing the respective resonance frequency of said slot line to vary accordingly.

3. The tunable stripline resonator as claimed in claim 1, wherein said floating line conductor is a microstrip transmission line.

4. The tunable stripline resonator as claimed in claim 2, wherein said floating line conductor is a microstrip transmission line.

5. The tunable stripline resonator as claimed in claim 3, wherein one end of the microstrip transmission line is shorted and then connected to said outer ground conductor and the other end thereof is provided with a capacitive element for connecting said microstrip transmission line conductor with said outer ground conductor thereby to make the length of the microstrip transmission line not greater than one fourth of the resonance frequency wavelength.

6. The tunable stripline resonator as claimed in claim 3, wherein one end of the microstrip transmission line is shorted and then connected to said outer ground conductor and the other end thereof is provided with a plane electrode to make the length of the transmission line not greater than one fourth of the resonance frequency wavelength.

7. The tunable stripline resonator as claimed in claim 1, wherein said floating line conductor is interposed between two outer ground conductors arranged in parallel, said two outer ground conductors having a space there between filled with a dielectric material, and the floating line conductor has one of a linear, polygonal, and circular section shape.

8. The tunable stripline resonator as claimed in claim 2, wherein said floating line conductor is interposed between two outer ground conductors arranged in parallel, said two outer ground conductors having a space there between filled with a dielectric material, and the floating line conductor has one of a linear, polygonal, and circular section shape.

9. The tunable stripline resonator as claimed in claim 6, wherein one end of the microstrip transmission line is shorted and then connected to said outer ground conductor and the other end thereof is provided with a capacitive element for connecting said microstrip transmission line with said outer ground conductor to make the length of the transmission line not greater than one fourth of the resonance frequency wavelength.

10. The tunable stripline resonator as claimed in claim 1, wherein said outer ground conductor has one of an axially-symmetrical polygonal prism and circular cylinder configuration, and said floating line conductor has one of an axially-symmetrical polygonal prism and circular cylinder configuration while serving as a central conductor, the axis of said outer ground conductor and the axis of said floating line conductor coinciding with each other, and said outer ground conductor and said floating line conductor having a space formed there between wherein said space is filled with a dielectric material to form a coaxial transmission line construction.

11. The tunable stripline resonator as claimed in claim 2, wherein said outer ground conductor has one of an axially-symmetrical polygonal prism and circular cylinder configuration, and said floating line conductor has one of an axially-symmetrical polygonal prism and circular cylinder configuration while serving as a central conductor, the axis of said outer ground conductor and the axis of said floating line conductor coinciding with each other, and said outer ground conductor and said floating line conductor having a space formed there between wherein said space is filled with a dielectric material to form a coaxial transmission line construction.

12. The tunable stripline resonator as claimed in claim 10, wherein one end of the floating line is shorted and then connected to said outer ground conductor and the other end thereof is provided with a capacitive element for connecting said floating line with said outer ground conductor thereby to make the length of the floating line not greater than one fourth of the resonance frequency wavelength.

13. A tunable stripline resonator as claimed in claim 3, wherein a portion of the microstrip transmission line in close proximity to the slot line has a width different from a remaining portion of the microstrip transmission line not in close proximity to the slot line.

14. A resonator as claimed in claim 5, wherein a portion of the microstrip transmission line in close proximity to the slot line has a width different from a remaining portion of the microstrip transmission line not in close proximity to the slot line.

15. A tunable stripline resonator as claimed in claim 7, wherein a portion of the floating transmission line in close proximity to the slot line has a width different from a remaining portion of the floating transmission line not in close proximity to the slot line.

16. A tunable stripline resonator as claimed in claim 10, wherein a portion of the central conductor in close proximity to the slot line has a width different from a remaining portion of the central conductor.

17. A tunable stripline resonator as claimed in claim 12, wherein a portion of the central conductor in close proximity to the slot line has a width different from a remaining portion of the central conductor.

18. A tunable stripline resonator comprising:
an outer ground conductor having a ground potential adhered to one surface of a dielectric substrate;
a floating line conductor arranged apart from and in parallel with said outer ground conductor, said floating line conductor allowing a standing-wave current to flow therethrough to form one of a TEM mode and quasi-TEM mode electromagnetic field around said line conductor; and
a slot line located on said outer ground conductor in close proximity and perpendicular to said line conductor, said slot line having two ends which are shorted and a capacitive element connected across the slot line, the capacitive element having a capacitance for varying the resonance frequency of the resonator.

19. A tunable stripline resonator as claimed in claim 18, wherein the capacitive element is to varactor diode having a voltage applied thereto to vary the resonance frequency of the resonator.

20. A tunable stripline resonator as claimed in claim 19, wherein said slot line comprises a plurality of shorting conductors provided transversely thereon for creating transverse short circuits across the slot line and, wherein the center frequency of the variable resonance frequency of the resonator can be determined by successive removal of the shorting conductors which results in the effective varying of the electrical line length of said slot line.

21. A tunable stripline resonator as claimed in claim 18, wherein the floating line conductor is a microstrip transmission line.

22. A tunable stripline resonator as claimed in claim 19, wherein the floating line conductor is a microstrip transmission line.

23. A tunable stripline resonator as claimed in claim 20, wherein the floating line conductor is a microstrip transmission line.

24. The tunable stripline resonator as claimed in claim 21, wherein one end of the microstrip transmission line is shorted and then connected to said outer ground conductor and the other end thereof is provided with a capacitive element for connecting said microstrip transmission line conductor with said outer ground conductor to make the length of the microstrip transmission line not greater than one fourth of the resonance frequency wavelength.

25. The tunable stripline resonator as claimed in claim 18, wherein said floating line conductor is interposed between two outer ground conductors arranged in parallel, said two outer ground conductors having a space there between filled with a dielectric material, and the floating line conductor having one of a linear, polygonal, and circular section shape.

26. The tunable stripline resonator as claimed in claim 19, wherein said floating line conductor is interposed between two outer ground conductors arranged in parallel, and said two outer ground conductors have a space formed there between, wherein said space is filled with a dielectric material, and the floating line conductor has one of a linear, polygonal, and circular section shape.

27. The tunable stripline resonator as claimed in claim 20, wherein said floating line conductor is interposed between two outer ground conductors arranged in parallel, and said two outer ground conductors have a space formed there between, wherein said space is filled with a dielectric material, and the floating line conductor has one of linear, polygonal, and circular section shape.

28. The tunable stripline resonator as claimed in claim 25, wherein one end of the floating line is shorted and then connected to said outer ground conductor and the other end thereof is provided with a capacitive element for connecting said floating line with said outer ground conductor to make the length of the floating line not greater than one fourth of the resonance frequency wavelength.

29. The tunable stripline resonator as claimed in claim 18, wherein said outer ground conductor has one of an axially-symmetrical polygonal prism and circular cylinder configuration, and said floating line conductor has one of an axially-symmetrical polygonal prism and circular cylinder configuration while serving as a central conductor, the axis of the outer ground conductor and the axis of the floating line conductor coinciding with each other, and said outer ground conductor and said floating line conductor having a space formed there between, wherein said space is filled with a dielectric material to form a coaxial transmission line construction.

30. The tunable stripline resonator as claimed in claim 29, wherein one end of a floating line conductor is shorted and then connected to said outer ground conductor and the other end thereof is provided with a capacitive element for connecting said floating line conductor with said outer ground conductor to make the length of the floating line conductor not greater than one fourth of the resonance frequency wavelength.

31. A tunable stripline resonator as claimed in claim 21, wherein a portion of the transmission line in close proximity to the slot line has a width different from the remaining portion of the transmission line not in close proximity to the slot line.

32. A resonator as claimed in claim 29, wherein a portion of the central conductor in close proximity to the slot line has a width different from a remaining portion of the central conductor.

33. A tunable stripline resonator as claimed in claim 30, wherein a portion of the central conductor in close proximity to the slot line has a width different from a remaining portion of the central conductor line.

34. A tunable stripline resonator as claimed in claim 1, wherein said slot line has an opening and wherein said slot line is shielded with a shield conductor to reduce an electromagnetic field energy to be radiated through said opening of the slot line to outside of the resonator.

35. A tunable stripline resonator as claimed in claim 18, wherein said slot line has an opening and wherein said slot line is shielded with a shield conductor to reduce an electromagnetic field energy to be radiated through said opening of the slot line to outside of the resonator.

36. A band-pass high-frequency filter comprising first and second tunable stripline resonators each as claimed in claim 1 coupled to each other by one of an electric field, magnetic field, and electromagnetic field, and input and output terminals coupled respectively to said first and said second tunable stripline resonators by one of an electric field, magnetic field, and electromagnetic field.

37. A band-pass high-frequency filter comprising first and second tunable stripline resonators each as claimed in claim 2 coupled to each other by one of an electric field, magnetic field, and electromagnetic field, and input and output terminals coupled respectively to said first and said second tunable stripline resonators by one of an electric field, magnetic field, and electromagnetic field.

38. A band-pass high-frequency filter comprising first and second tunable stripline resonators each as claimed in claim 19 coupled to each other by one of an electric field, magnetic field, and electromagnetic field, input and output terminals coupled respectively to said first and said second tunable stripline resonators by one of an electric field, magnetic field, and electromagnetic field, and a varactor diode to which is applied a voltage for varying the resonance frequency of the resonator.

39. A band-pass high-frequency filter comprising a first and a second tunable stripline resonators each as claimed in claim 20 coupled to each other by one of an electric field, magnetic field, and electromagnetic field, input and output terminals coupled respectively to said first and said second tunable stripline resonators by one of an electric field, magnetic, field, and electromagnetic field, and a varactor diode to which is applied a voltage for varying the resonance frequency of the resonator.

40. A voltage-controlled oscillator comprising a tunable stripline resonator as claimed in claim 19, a semiconductor amplifier element, and a varactor diode to which is applied a voltage for varying the resonance frequency of the resonator.

41. A voltage-controlled oscillator comprising a tunable stripline resonator as claimed in claim 20, a semiconductor amplifier element, and a varactor diode to which is applied a voltage for varying the resonance frequency of the resonator.

42. A tunable stripline resonator having a microstrip line structure comprising:
a dielectric substrate;
an outer ground conductor having a ground potential adhered to a rear surface of said dielectric substrate;
a microstrip transmission line conductor provided on an upper surface of said substrate, said microstrip line having one end electrical open and an other end shorted by a short-circuit conductor provided on one edge surface of said substrate thereby to connect said outer ground conductor with said microstrip line via said short-circuit conductor, said microstrip line conductor being arranged apart from and in parallel with said outer ground conductor, thereby allowing a standing-wave current to flow through said microstrip line conductor to form one of a TEM mode or quasi-TEM mode electromagnetic field around said line conductor;
a slot transmission line provided on said outer ground conductor, said slot transmission line having two ends wherein each one of said two ends are shorted so as to achieve a specified variable electric line length, said slot line being located apart from said short-circuit conductor by a predetermined distance said slot line further located symmetrically and perpendicularly with respect to said microstrip line, thereby varying the resonance frequency of said tunable stripline resonator by varying the electrical line length of said slot line.

* * * * *